(12) United States Patent
Sung et al.

(10) Patent No.: US 9,640,473 B2
(45) Date of Patent: May 2, 2017

(54) SEMICONDUCTOR PACKAGES

(71) Applicant: SK hynix Inc., Incheon-si, Gyeonggi-do (KR)

(72) Inventors: Ki Jun Sung, Cheongju-si (KR); Young Geun Yoo, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 14/811,368

(22) Filed: Jul. 28, 2015

(65) Prior Publication Data
US 2016/0247781 A1 Aug. 25, 2016

(30) Foreign Application Priority Data
Feb. 24, 2015 (KR) .......................... 10-2015-0025836

(51) Int. Cl.
| | | |
|---|---|---|
| H01L 23/02 | (2006.01) | |
| H01L 21/00 | (2006.01) | |
| H01L 23/498 | (2006.01) | |
| H01L 23/538 | (2006.01) | |
| H01L 23/00 | (2006.01) | |
| H01L 23/13 | (2006.01) | |
| H01L 25/065 | (2006.01) | |
| H01L 25/00 | (2006.01) | |

(52) U.S. Cl.
CPC ........ H01L 23/49827 (2013.01); H01L 23/13 (2013.01); H01L 23/5389 (2013.01); H01L 24/19 (2013.01); H01L 24/20 (2013.01); H01L 24/96 (2013.01); H01L 25/065 (2013.01); H01L 25/50 (2013.01); *H01L 2224/04105* (2013.01); *H01L 2224/12105* (2013.01); *H01L 2224/16235* (2013.01); *H01L 2224/32225* (2013.01); *H01L 2224/73217* (2013.01); *H01L 2224/92144* (2013.01); *H01L 2924/141* (2013.01); *H01L 2924/1431* (2013.01); *H01L 2924/1434* (2013.01); *H01L 2924/1436* (2013.01); *H01L 2924/1437* (2013.01); *H01L 2924/1438* (2013.01); *H01L 2924/1441* (2013.01); *H01L 2924/15151* (2013.01); *H01L 2924/15153* (2013.01); *H01L 2924/15311* (2013.01); *H01L 2924/15321* (2013.01)

(58) Field of Classification Search
CPC ....................... H01L 23/49827; H01L 23/3114
USPC .......................... 257/686, 724–731; 438/109
See application file for complete search history.

(56) References Cited

U.S. PATENT DOCUMENTS

| | | | |
|---|---|---|---|
| 8,227,904 B2 | 7/2012 | Braunisch et al. | |
| 8,618,654 B2* | 12/2013 | Sutardja ............ | H01L 23/49822 257/723 |
| 2010/0102428 A1* | 4/2010 | Lee ....................... | H01L 23/481 257/686 |
| 2011/0254160 A1* | 10/2011 | Tsai ....................... | H01L 21/486 257/738 |

* cited by examiner

*Primary Examiner* — Calvin Lee
(74) *Attorney, Agent, or Firm* — William Park & Associates Ltd.

(57) ABSTRACT

Semiconductor packages are provided. A semiconductor package may include an embedding substrate including a cavity therein and a connection window in a bottom portion of the cavity. The semiconductor package may include a semiconductor chip disposed in the cavity and coupled to chip connectors, the chip connectors of the semiconductor chip inserted into the connection window. The semiconductor package may include a dielectric layer filling the cavity and the connection window and configured to expose end portions of the chip connectors and to substantially cover the semiconductor chip. Related memory cards and related electronic systems are also provided.

19 Claims, 10 Drawing Sheets

SEMICONDUCTOR PACKAGES

CROSS-REFERENCE TO RELATED APPLICATION

The present application claims priority under 35 U.S.C. 119(a) to Korean Application No. 10-2015-0025836, filed on Feb. 24, 2015, in the Korean intellectual property Office, which is incorporated herein by reference in its entirety as set forth in full.

BACKGROUND

1. Technical Field

Various embodiments generally relate to semiconductor packages employing an embedded package scheme.

2. Related Art

Lighter and smaller electronic products are increasingly in demand. The demand stems from the development of mobile systems such as smart phones. In response to such a demand, semiconductor packages employed in the electronic products have been continuously scaled down to reduce a thickness and a size thereof. A lot of effort has been focused on the realization of thin semiconductor packages. However, there may be some limitations in reducing a thickness of the semiconductor packages. For example, it may be difficult to reduce a thickness of the semiconductor packages because of a thickness of a package substrate on which a semiconductor chip is mounted and a loop height of bonding wires for electrically connecting the semiconductor chip to the package substrate. In particular, if a plurality of semiconductor chips are vertically stacked to realize a semiconductor stack package, the stacked semiconductor chips may be electrically connected to each other by bonding wires and may be encapsulated using an epoxy molding compound (EMC) material. Thus, a thickness of the semiconductor stack package may be increased more as a result.

SUMMARY

According to an embodiment, a semiconductor package may include an embedding substrate including a cavity opened at a first surface of the embedding substrate and a connection window in a bottom portion of the cavity opening a second surface of the embedding substrate opposite to the first surface. The semiconductor package may include a first semiconductor chip disposed in the cavity and coupled to first chip connectors including a first chip first connector and a first chip second connector, the first connector and the second connector of the first chip connectors of the first semiconductor chip inserted into the connection window. The semiconductor package may include a dielectric layer covering the first semiconductor chip to fill the cavity and the connection window with exposing end portions of the first chip first and second connectors. The semiconductor package may include an external connector disposed on the dielectric layer. The semiconductor package may include a second semiconductor chip disposed on the second surface of the embedding substrate and including a second chip first connector and a second chip second connector, the second chip first connector connected to the first chip first connector. The semiconductor package may include a conductive interconnection structure electrically coupling the second chip second connector to the external connector.

According to an embodiment, a semiconductor package may include an embedding substrate including a cavity opened at a first surface of the embedding substrate and including a connection window penetrating a bottom portion of the cavity opening a second surface of the embedding substrate, the second surface of the embedding substrate opposite to the first surface. The semiconductor package may include a first semiconductor chip disposed in the cavity and coupled to first chip connectors, the first chip connectors of the first semiconductor chip inserted into the connection window. The semiconductor package may include a dielectric layer filling the cavity and the connection window to expose end portions of the first chip connectors and covering the first semiconductor chip. The semiconductor package may include a second semiconductor chip disposed on the second surface of the embedding substrate and coupled to second chip connectors, the second chip connectors of the second semiconductor chip connected to at least one of the first chip connectors.

According to an embodiment, a semiconductor package may include an embedding substrate including a cavity therein and a connection window in a bottom portion of the cavity. The semiconductor package may include a semiconductor chip disposed in the cavity and coupled to chip connectors, the chip connectors of the semiconductor chip inserted into the connection window. The semiconductor package may include a dielectric layer filling the cavity and the connection window and configured to expose end portions of the chip connectors and to substantially cover the semiconductor chip.

According to an embodiment, there may be provided a memory card including a package. The package may include an embedding substrate including a cavity opened at a first surface of the embedding substrate and including a connection window penetrating a bottom portion of the cavity opening a second surface of the embedding substrate, the second surface of the embedding substrate opposite to the first surface. The package may include a first semiconductor chip disposed in the cavity and coupled to first chip connectors including a first connector and a second connector, the first connector and the second connector of the first chip connectors of the first semiconductor chip inserted into the connection window. The package may include a dielectric layer filling the cavity and the connection window to expose end portions of the first and second connectors of the first chip connectors and covering the first semiconductor chip. The package may include an external connector disposed on the dielectric layer. The package may include a second semiconductor chip disposed on the second surface of the embedding substrate and coupled to a first connector of second chip connectors, the first connector of the second chip connectors of the second semiconductor chip connected to the first connector of the first chip connectors. The package may include a conductive connection structure electrically connecting a second connector of the second chip connectors to the external connector.

According to an embodiment, there may be provided a memory card including a package. The package may include an embedding substrate including a cavity opened at a first surface of the embedding substrate and including a connection window penetrating a bottom portion of the cavity opening a second surface of the embedding substrate, the second surface of the embedding substrate opposite to the first surface. The package may include a first semiconductor chip disposed in the cavity and coupled to first chip connectors, the first chip connectors of the first semiconductor chip are inserted into the connection window. The package may include a dielectric layer filling the cavity and the connection window to expose end portions of the first chip connectors and covering the first semiconductor chip. The package may include a second semiconductor chip disposed on the second surface of the embedding substrate and coupled to second chip connectors, the second chip connectors of the second semiconductor chip connected to at least one of the first chip connectors.

According to an embodiment, there may be provided a memory card including a package. The package may include an embedding substrate including a cavity therein and a connection window in a bottom portion of the cavity. The package may include a semiconductor chip disposed in the cavity and coupled to chip connectors, the chip connectors of the semiconductor chip inserted into the connection window. The package may include a dielectric layer filling the cavity and the connection window and configured to expose end portions of the chip connectors and to substantially cover the semiconductor chip.

According to an embodiment, there may be provided an electronic system including a package. The package may include an embedding substrate including a cavity opened at a first surface of the embedding substrate and including a connection window penetrating a bottom portion of the cavity opening a second surface of the embedding substrate, the second surface of the embedding substrate opposite to the first surface. The package may include a first semiconductor chip disposed in the cavity and coupled to first chip connectors including a first connector and a second connector, the first connector and the second connector of the first chip connectors of the first semiconductor chip inserted into the connection window. The package may include a dielectric layer filling the cavity and the connection window to expose end portions of the first and second connectors of the first chip connectors and covering the first semiconductor chip. The package may include an external connector disposed on the dielectric layer. The package may include a second semiconductor chip disposed on the second surface of the embedding substrate and coupled to a first connector of second chip connectors, the first connector of the second chip connectors of the second semiconductor chip connected to the first connector of the first chip connectors. The package may include a conductive connection structure electrically connecting a second connector of the second chip connectors to the external connector.

According to an embodiment, there may be provided an electronic system including a package. The package may include an embedding substrate including a cavity opened at a first surface of the embedding substrate and including a connection window penetrating a bottom portion of the cavity opening a second surface of the embedding substrate, the second surface of the embedding substrate opposite to the first surface. The package may include a first semiconductor chip disposed in the cavity and coupled to first chip connectors, the first chip connectors of the first semiconductor chip inserted into the connection window. The package may include a dielectric layer filling the cavity and the connection window to expose end portions of the first chip connectors and covering the first semiconductor chip. The package may include a second semiconductor chip disposed on the second surface of the embedding substrate and coupled to second chip connectors, the second chip connectors of the second semiconductor chip connected to at least one of the first chip connectors.

According to an embodiment, there may be provided an electronic system including a package. The package may include an embedding substrate including a cavity therein and a connection window in a bottom portion of the cavity. The package may include a semiconductor chip disposed in the cavity and coupled to chip connectors, the chip connectors of the semiconductor chip inserted into the connection window. The package may include a dielectric layer filling the cavity and the connection window and configured to expose end portions of the chip connectors to substantially cover the semiconductor chip.

DETAILED DESCRIPTION

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present disclosure.

It will also be understood that when an element is referred to as being located "on", "over", "above", "under", "beneath" or "below" another element, it may directly contact the other element, or at least one intervening element may be present therebetween. Accordingly, the terms such as "on", "over", "above", "under", "beneath", "below" and the like that are used herein are for the purpose of describing particular embodiments only and are not intended to limit the scope of the present disclosure.

It will be further understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion. The term "semiconductor chips"

used herein may be obtained by separating a semiconductor substrate having a plurality of integrated circuits into a plurality of pieces using, for example, a die sawing process.

The semiconductor chips may correspond to memory chips or non-memory chips. The memory chips may include dynamic random access memory (DRAM) circuits, static random access memory (SRAM) circuits, flash circuits, magnetic random access memory (MRAM) circuits, resistive random access memory (ReRAM) circuits, ferroelectric random access memory (FeRAM) circuits or phase change random access memory (PcRAM) circuits which are integrated on and/or in the semiconductor substrate. The non-memory chips may include logic circuits or analog circuits which are integrated on and/or in the semiconductor substrate. In some cases, the term "semiconductor substrate" used herein may be construed as a semiconductor chip or a semiconductor die in which integrated circuits are formed.

Various embodiments may be directed to semiconductor packages, memory cards including the same, and electronic systems including the same.

Figure 1:
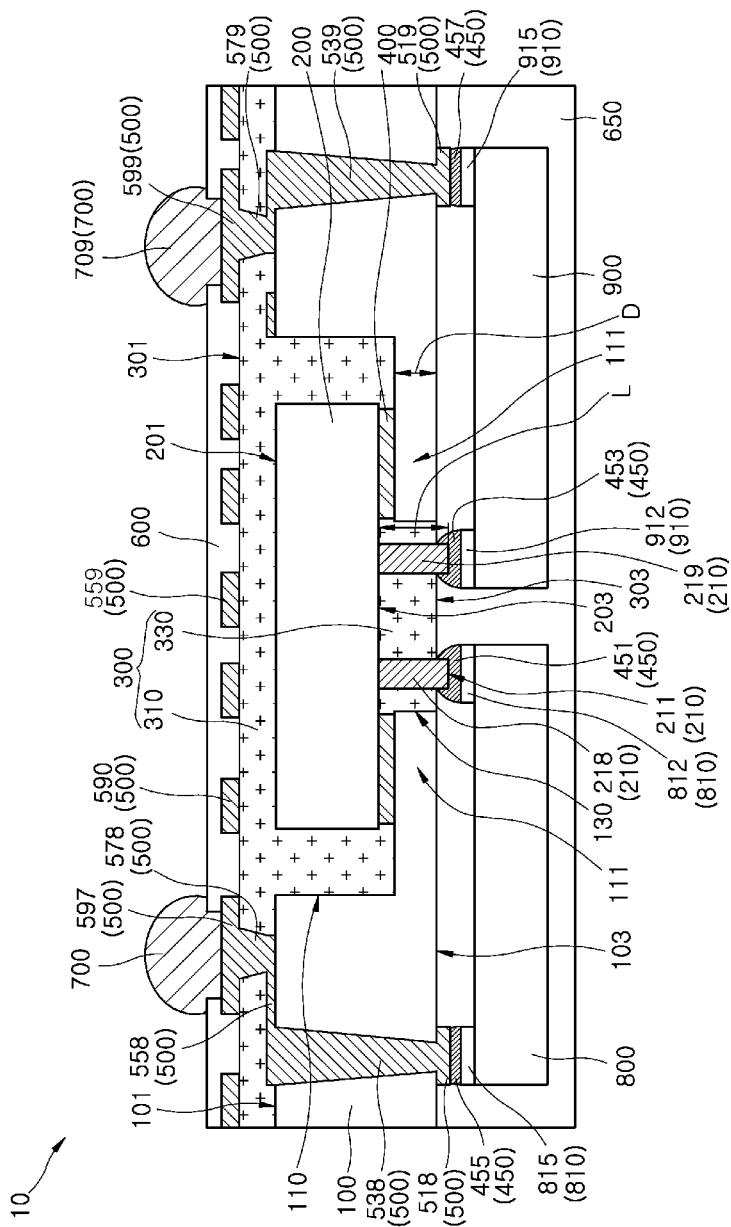
FIG. 1 is a cross-sectional view illustrating a representation of an example of a semiconductor package according to an embodiment.
Figure 2:
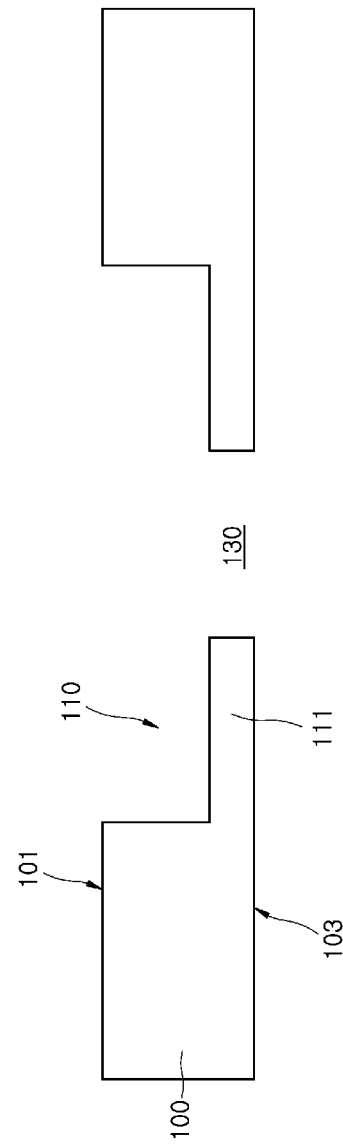
FIGS. 2 and 3 are a cross-sectional view and a plan view of a representation of an example of an embedding substrate included in a semiconductor package according to an embodiment, respectively.
Figure 3:
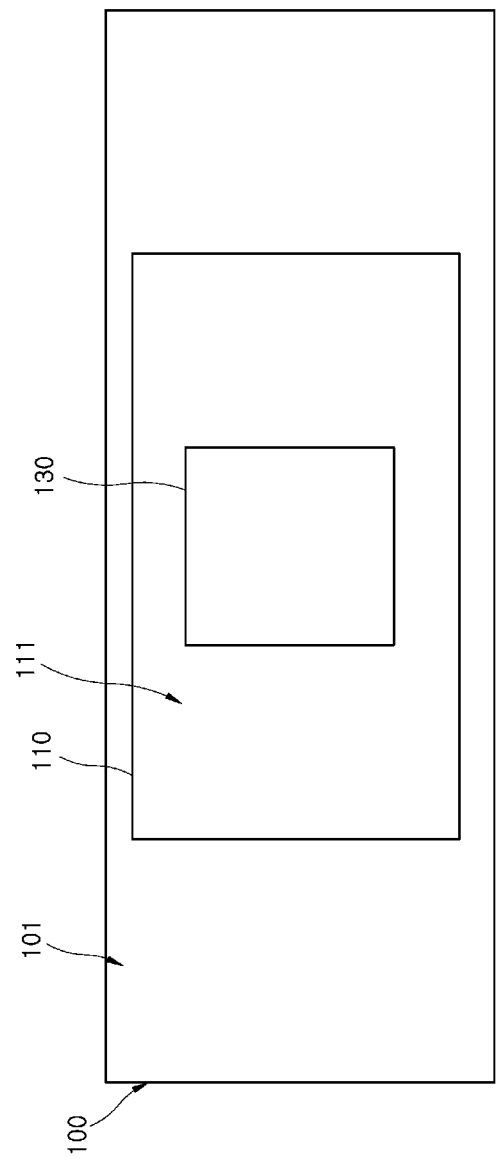

FIG. 1 is a cross-sectional view illustrating a representation of an example of a semiconductor package 10 according to an embodiment. FIGS. 2 and 3 are a cross-sectional view and a plan view of a representation of an example of an embedding substrate included in a semiconductor package according to an embodiment, respectively.

Referring to FIG. 1, the semiconductor package 10 may include a first semiconductor chip 200 disposed in a cavity 110 provided in a body of an embedding substrate 100. The embedding substrate 100 may be a substrate or a layer including a dielectric material and may be a plate-type member having a first surface 101 and a second surface 103 that face each other.

The cavity 110 may be configured as opened at the first surface 101 of the embedding substrate 100 and to be recessed toward the second surface 103, as illustrated in FIGS. 1 and 2. A width of the cavity 110 may be greater than a width of the first semiconductor chip 200 so that at least one first semiconductor chip 200 can be disposed in the cavity 110. The cavity 110 may be provided to have a depth greater than a thickness of the first semiconductor chip 200. However, in some embodiments, the depth of the cavity 110 may be less than the thickness of the first semiconductor chip 200. In such an example, a portion of the first semiconductor chip 200 may protrude from the first surface 101 of the embedding substrate 100. For example, a third surface 201 of the first semiconductor chip 200 opposite to the second surface 103 may be located at a level which is higher than the first surface 101 of the embedding substrate 100. In an embodiment, the cavity 110 may be provided so that the third surface 201 of the first semiconductor chip 200 may be substantially coplanar with the first surface 101 of the embedding substrate 100.

A connection window 130 may be provided to penetrate a portion of the embedding substrate 100, which corresponds to a bottom portion 111 of the cavity 110. The connection window 130 may provide a space into which first chip connectors 210 (218 and 219) of the first semiconductor chip 200 are inserted. The first chip connectors 210 may be disposed on a fourth surface 203 of the first semiconductor chip 200 facing the bottom portion 111 of the cavity 110 to electrically connect the first semiconductor chip 200 to other elements. The first chip connectors 210 may be disposed on a central portion of the fourth surface 203 of the first semiconductor chip 200. The connection window 130 into which the first chip connectors 210 (218 and 219) are inserted may pass through a central portion of the bottom portion 111 of the cavity 110 to have a through hole shape, as illustrated in FIGS. 2 and 3. The connection window 130 may have a tetragon shape such as, for example but not limited to, a rectangular shape in a plan view.

An adhesive insulation layer 400 may be disposed between the fourth surface 203 of the first semiconductor chip 200 and the bottom portion 111 of the cavity 110. The adhesive insulation layer 400 may be disposed to fix the first semiconductor chip 200 to the bottom portion 111 of the cavity 110.

The first chip connectors 210 may be bumps, for example, pillar bumps which are connected to chip pads (not illustrated) of the first semiconductor chip 200. The first chip connectors 210 may have a vertical length L which is greater than a thickness D of the bottom portion 111 of the cavity 110. Since the length L of the first chip connectors 210 is greater than the thickness D of the bottom portion 111 of the cavity 110, end portions 211 of the first chip connectors 210 opposite to the first semiconductor chip 200 may protrude out of the connection window 130 by a certain height if the first semiconductor chip 200 is disposed in the cavity 110.

The semiconductor package 10 may further include a dielectric layer 300 filling the cavity 110 of the embedding substrate 100. The dielectric layer 300 may extend to cover the third surface 201 of the first semiconductor chip 200 and the first surface 101 of the embedding substrate 100. The dielectric layer 300 may be provided by stacking laminated build up films or laminated dielectric sheets on the embedding substrate 100. Alternatively, the dielectric layer 300 may be provided by coating a dielectric material or a dielectric resin material to fill the cavity 110. The dielectric layer 300 may be an insulation layer to cover and protect the first semiconductor chip 200.

The dielectric layer 300 may include a first dielectric portion 310 substantially filling the cavity 110 and covering the first semiconductor chip 200. The dielectric layer 300 may include a second dielectric portion 330 filling the connection window 130. The second dielectric portion 330 may fill a space in the connection window 130 to surround and insulate the first chip connectors 210 which are inserted into the connection window 130. The second dielectric portion 330 may fill the connection window 130 not to extend onto the second surface 103 of the embedding substrate 100. In addition, the first dielectric portion 310 may have a fifth surface 301 opposite to the embedding substrate 100. The second dielectric portion 330 may have a sixth surface 303 opposite to the first semiconductor chip 200. In such an example, the end portions 211 of the first chip connectors 210 may protrude from the sixth surface 303 of the second dielectric portion 330 by a certain height.

The semiconductor package 10 may further include a second semiconductor chip 800 mounted on the second surface 103 of the embedding substrate 100. The second semiconductor chip 800 may include second chip connectors 810 to electrically connect the second semiconductor chip 800 to other elements. The second semiconductor chip 800 may have substantially the same function or the same shape as the first semiconductor chip 200. However, in some embodiments, the second semiconductor chip 800 may be a semiconductor chip having a function different from a function of the first semiconductor chip 200 or having a shape different from a shape of the first semiconductor chip 200. The second chip connectors 810 may be chip pads or bumps. A vertical length or a height of the second chip connectors 810 may be less than the vertical length L of the first chip connectors 210.

Referring to FIG. 1, the second semiconductor chip 800 may be mounted on the second surface 103 of the embedding substrate 100 so that at least one first connector 812 of the second chip connectors 810 is electrically connected to at least one first connector 218 of the first chip connectors 210. The first connector 812 of the second chip connectors 810 may be directly combined with the first connector 218 of the first chip connectors 210.

Since the end portion 211 of the first connector 218 of the first chip connectors 210 protrudes from the sixth surface 303 of the second dielectric portion 330, the first connector 812 of the second chip connectors 810 may be directly combined with the protruded end portion 211 of the first connector 218 of the first chip connectors 210. A conductive adhesive layer 450, for example, a first conductive adhesive layer 451 may be introduced to combine the first connector 812 of the second chip connectors 810 with the first connector 218 of the first chip connectors 210. The first conductive adhesive layer 451 may include a solder material. The first conductive adhesive layer 451 may be disposed on the first connector 812 of the second chip connectors 810 to have a bump shape, and the protruded end portion 211 of the first connector 218 of the first chip connectors 210 may be infiltrated or embedded into the first conductive adhesive layer 451. The protruded end portion 211 of the first connector 218 of the first chip connectors 210 is infiltrated into and surrounded by the first conductive adhesive layer 451, as illustrated in FIG. 1. Thus, coherence between the first connector 218 and the first conductive adhesive layer 451 may be improved.

External connectors 700 may be disposed on the fifth surface 301 of the dielectric layer 300 to electrically connect the semiconductor package 10 to an external device such as, for example but not limited to, an external module board. The external connectors 700 may be connection members such as solder balls. Since the external connectors 700 are disposed on the fifth surface 301 of the dielectric layer 300 opposite to the embedding substrate 100, a space in which the second semiconductor chip 800 is disposed may be provided on the second surface 103 of the embedding substrate 100 opposite to the external connectors 700. Because the second semiconductor chip 800 is mounted on the second surface 103 of the embedding substrate 100, the semiconductor package 10 may be realized to have a hybrid embedded package form that includes the first semiconductor chip 200 embedded between the embedding substrate 100 and the dielectric layer 300 as well as the second semiconductor chip 800 mounted on the embedding substrate 100. Accordingly, a thickness of the semiconductor package 10 may be reduced, or the number of the semiconductor chips disposed in the semiconductor package 10 may be increased in a limited thickness of the semiconductor package 10.

Referring to FIG. 1, the semiconductor package 10 may further include a conductive connection structure 500 that are disposed in the embedding substrate 100 and the dielectric layer 300 to electrically connect the external connectors 700 to the second semiconductor chip 800. The first semiconductor chip 200 embedded in the embedding substrate 100 and covered with the dielectric layer 300 may be electrically connected to the external connectors 700 through the second semiconductor chip 800 and the conductive connection structure 500. The conductive connection structure 500 may be configured to include a plurality of interconnection trace patterns located at different levels and at least one via portion disposed between the plurality of interconnection trace patterns, like, for example but not limited to, a circuit interconnection structure of a printed circuit board (PCB). The conductive connection structure 500 may include at least one of various conductive materials such as various metal materials. For example, the conductive connection structure 500 may include a copper material or an alloy containing copper.

The conductive connection structure 500 may include a first internal connector 518 disposed on the second surface 103 of the embedding substrate 100 and is electrically connected to a second connector 815 of the second chip connectors 810 of the second semiconductor chip 800. The first internal connector 518 may correspond to a landing pad disposed on the second surface 103 of the embedding substrate 100 and may be aligned with and connected to the second connector 815 of the second chip connectors 810 when the second semiconductor chip 800 is mounted on the second surface 103 of the embedding substrate 100. A second conductive adhesive layer 455 may be disposed to combine the second connector 815 of the second chip connectors 810 with the first internal connector 518. The second conductive adhesive layer 455 may include a solder material. The second semiconductor chip 800 may be mounted on the embedding substrate 100 so that the second connectors 815 of the second chip connectors 810 are respectively aligned and combined with the first internal connectors 518 and the first connectors 812 of the second chip connectors 810 are respectively aligned and combined with the first connectors 218 of the first chip connectors 210. The length L of the first connectors 218 of the first chip connectors 210 may be determined so that a height of the protruded end portions 211 of the first connectors 218 of the first chip connectors 210 is substantially equal to a height of the first internal connectors 518, for the horizontal balance of the second semiconductor chip 800.

The conductive connection structure 500 may include a first via portion 538 substantially penetrating the embedding substrate 100. The first via portion 538 may be connected to the first internal connector 518 to act as an internal connector. The first via portion 538 may include a conductive material such as a metal material. For example, the first via portion 538 may include a copper material or an alloy containing copper. The first via portion 538 may extend from the second surface 103 to the first surface 101 of the embedding substrate 100 to penetrate the embedding substrate 100. For example, the first via portion 538 may correspond to a through electrode that passes through a body of the embedding substrate 100 adjacent to the cavity 110.

The conductive connection structure 500 may include a second via portion 578 substantially penetrating the dielectric layer 300 on the first surface 101 of the embedding substrate 100. The second via portion 578 may be electrically connected to the first via portion 538. The second via portion 578 may be vertically aligned with and connected to the first via portion 538. In such an example, the first via portion 538 and the second via portion 578 may constitute a single unified via structure. If the second via portion 578 is not vertically aligned with the first via portion 538 and is laterally spaced apart from the first via portion 538, the second via portion 578 may be electrically connected to the first via portion 538 through a first trace pattern 558. The first trace pattern 558 may be disposed on the first surface 101 of the embedding substrate 100. The second via portion 578 may be electrically connected to one of the external connectors 700 through a second internal connector 597 acting as a landing pad to which the external connector 700 is attached. For example, the second internal connector 597 may be disposed between the second via portion 578 and the external connector 700.

The second internal connector 597 may be disposed on the fifth surface 301 of the dielectric layer 300, and a plurality of second trace patterns 590 may also be disposed on the fifth surface 301 of the dielectric layer 300. A mask layer 600 covering the second trace patterns 590 and exposing the second internal connector 597 may be disposed on the dielectric layer 300. The mask layer 600 may be a dielectric layer. For example, the mask layer 600 may include a solder resist material. The fifth surface 301 of the dielectric layer 300 may provide a region on which the external connectors 700 and the second trace patterns 590 are disposed.

Referring still to FIG. 1, the semiconductor package 10 may further include a third semiconductor chip 900 mounted on the second surface 103 of the embedding substrate 100 adjacent to the second semiconductor chip 800. For example, the second and third semiconductor chips 800 and 900 may be located side by side without vertically overlapping with each other. The third semiconductor chip 900 may have substantially the same function or the same shape as any one of the first and second semiconductor chips 200 and 800. However, in some embodiments, the third semiconductor chip 900 may be a semiconductor chip having a function different from functions of the first and second semiconductor chips 200 and 800 or having a shape different from shapes of the first and second semiconductor chips 200 and 800. The third semiconductor chip 900 may be mounted on the second surface 103 of the embedding substrate 100 so that at least one first connector 912 of third chip connectors 910 of the third semiconductor chip 900 is electrically connected to at least one second connector 219 of the first chip connectors 210. The first connector 912 of third chip connectors 910 may be directly combined with and electrically connected to the second connector 219 of the first chip connectors 210.

Since the end portion 211 of the second connector 219 of the first chip connectors 210 protrudes from the sixth surface 303 of the second dielectric portion 330, the first connector 912 of the third chip connectors 910 may be directly combined with the protruded end portion 211 of the second connector 219 of the first chip connectors 210. The conductive adhesive layer 450, for example, a third conductive adhesive layer 453 may be introduced to combine the first connector 912 of the third chip connectors 910 with the second connector 219 of the first chip connectors 210. The third conductive adhesive layer 453 may include a solder material. The third conductive adhesive layer 453 may be disposed on the first connector 912 of the third chip connectors 910 to have a bump shape, and the protruded end portion 211 of the second connector 219 of the first chip connectors 210 may be infiltrated or embedded into the third conductive adhesive layer 453.

External connectors 709 may be disposed on the fifth surface 301 of the dielectric layer 300 to electrically connect the semiconductor package 10 to an external device such as, for example but not limited to, an external module board. The conductive connection structure 500 may be disposed to electrically connect the external connectors 709 to the third semiconductor chip 900. The first semiconductor chip 200 embedded in the embedding substrate 100 and covered with the dielectric layer 300 may be electrically connected to the external connectors 709 through the third semiconductor chip 900 and the conductive connection structure 500. The conductive connection structure 500 may include a third internal connector 519 disposed on the second surface 103 of the embedding substrate 100 and is electrically connected to a second connector 915 of the third chip connectors 910 of the third semiconductor chip 900. The third internal connector 519 may correspond to a landing pad disposed on the second surface 103 of the embedding substrate 100 and may be aligned with and connected to the second connector 915 of the third chip connectors 910 when the third semiconductor chip 900 is mounted on the second surface 103 of the embedding substrate 100. A fourth conductive adhesive layer 457 may be disposed to combine the second connector 915 of the third chip connectors 910 with the third internal connector 519. The fourth conductive adhesive layer 457 may include a solder material. The third semiconductor chip 900 may be mounted on the embedding substrate 100 so that the second connectors 915 of the third chip connectors 910 are respectively aligned and combined with the third internal connectors 519 and the first connectors 912 of the third chip connectors 910 are respectively aligned and combined with the second connectors 219 of the first chip connectors 210. The length L of the second connectors 219 of the first chip connectors 210 may be determined so that a height of the protruded end portions 211 of the second connectors 219 of the first chip connectors 210 are substantially equal to a height of the third internal connectors 519, for the horizontal balance of the third semiconductor chip 900.

The conductive connection structure 500 may include a third via portion 539 substantially penetrating the embedding substrate 100. The third via portion 539 may be connected to the third internal connector 519 to act as an internal connector. The third via portion 539 may include a conductive material such as a metal material. For example, the third via portion 539 may include a copper material or an alloy containing copper. The third via portion 539 may extend from the second surface 103 to the first surface 101 of the embedding substrate 100 to penetrate the embedding substrate 100. For example, the third via portion 539 may correspond to a through electrode passing through a body of the embedding substrate 100 adjacent to the cavity 110.

The conductive connection structure 500 may include a fourth via portion 579 substantially penetrating the dielectric layer 300 on the first surface 101 of the embedding substrate 100. The fourth via portion 579 may be electrically connected to the third via portion 539. The fourth via portion 579 may be vertically aligned with and connected to the third via portion 539. In an example, the third via portion 539 and the fourth via portion 579 may constitute a single unified via structure. If the fourth via portion 579 is not vertically aligned with the third via portion 539 and is laterally spaced apart from the third via portion 539, the fourth via portion 579 may be electrically connected to the third via portion 539. The third trace pattern 559 may be disposed on a fifth surface 301 of a first dielectric portion 310 opposite to the embedding substrate 100. The fourth via portion 579 may be electrically connected to one of the external connectors 709 through a fourth internal connector 599 acting as a landing pad to which the external connector 709 may be attached. For example, the fourth internal connector 599 may be disposed between the fourth via portion 579 and the external connector 709.

The semiconductor package 10 may further include a protection layer 650 disposed on the second surface 103 of the embedding substrate 100 to cover and protect the second and third semiconductor chips 800 and 900. The protection layer 650 may include a molding layer containing an epoxy molding compound (EMC) material.

Figure 4:
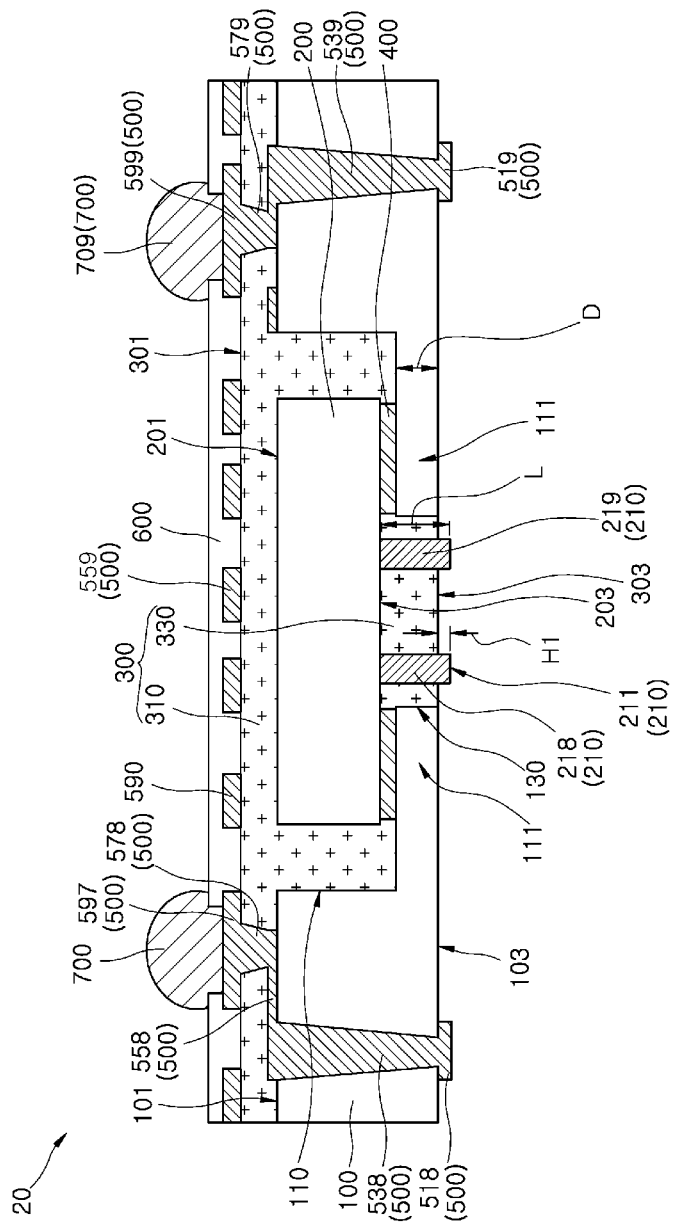
FIG. 4 is a cross-sectional view illustrating a representation of an example of a semiconductor package according to an embodiment.

FIG. 4 is a cross-sectional view illustrating a representation of an example of a semiconductor package 20 according to an embodiment. With regards to FIG. 4, the same reference numerals as used in FIGS. 1, 2 and 3 denote the same elements. Thus, descriptions of the same elements as set forth with reference to FIGS. 1, 2 and 3 will be omitted or briefly mentioned to avoid a repeated description.

Referring to FIG. 4, the semiconductor package 20 may include the first semiconductor chip 200 disposed in the cavity 110 provided in a body of the embedding substrate 100. The cavity 110 may be provided to be opened at the first surface 101 of the embedding substrate 100 and to be recessed toward the second surface 103. The third surface 201 of the first semiconductor chip 200 may be located at a level higher or lower than the first surface 101 of the embedding substrate 100. Alternatively, the third surface 201 of the first semiconductor chip 200 may be located at a level substantially coplanar with the first surface 101 of the embedding substrate 100.

The connection window 130 may be provided to penetrate a portion of the embedding substrate 100, which corresponds to the bottom portion 111 of the cavity 110. The connection window 130 may provide a space into which the first chip connectors 210 (218 and 219) are inserted. The adhesive insulation layer 400 may be disposed between the fourth surface 203 of the first semiconductor chip 200 and the bottom portion 111 of the cavity 110.

Since the first chip connectors 210 such as bumps have the vertical length L greater than the thickness D of the bottom portion 111 of the cavity 110, the end portions 211 of the first chip connectors 210 opposite to the first semiconductor chip 200 may protrude from the sixth surface 303 of the dielectric layer 300 filling the connection window 130 by a predetermined height H1 if the first semiconductor chip 200 is disposed in the cavity 110.

The semiconductor package 20 may further include the conductive connection structures 500 that are disposed in the embedding substrate 100 and the dielectric layer 300. The conductive connection structure 500 may be electrically connected to the external connectors 700 and may be disposed to have circuit interconnection structures. The conductive connection structure 500 may include the first internal connector 518 and the third internal connector 519 disposed on the second surface 103 of the embedding substrate 100. The conductive connection structure 500 may include the first via portion 538 and the third via portion 539 penetrating the embedding substrate 100. The first internal connector 518 may be connected to the first via portion 538, and the third internal connector 519 may be connected to the third via portion 539. The conductive connection structure 500 may include the second via portion 578 and the fourth via portion 579 substantially penetrating the dielectric layer 300 on the first surface 101 of the embedding substrate 100. The second via portion 578 may be electrically connected to the first via portion 538, and the fourth via portion 579 may be electrically connected to the third via portion 539. The conductive connection structure 500 may further include the first trace pattern 558 for electrically connecting the second via portion 578 to the first via portion 538. The first trace pattern 558 may be disposed on the first surface 101 of the embedding substrate 100. The second via portion 578 and the fourth via portion 579 may be electrically connected to the external connectors 700 and 709 through the second and fourth internal connectors 597 and 599 acting as landing pads, respectively. The second trace patterns 590 may be disposed on the dielectric layer 300.

The first chip connectors 210 of the first semiconductor chip 200 may be exposed at the sixth surface 303 of the dielectric layer 300 to be connected to an external device, and the first and third internal connectors 518 and 519 may also be exposed at the second surface 103 of the embedding substrate 100 to be connected to the external device. This semiconductor package 20 may be stacked on another semiconductor package having a similar shape to the semiconductor package 20 to constitute a stack package. In an embodiment, the first and third internal connectors 518 and 519 may be electrically connected to the first chip connectors 210 of the first semiconductor chip 200 through interconnection members, for example, redistributed interconnection lines (not illustrated). As a result, the first semiconductor chip 200 may be electrically connected to the external connectors 700 and 709.

Figure 5:
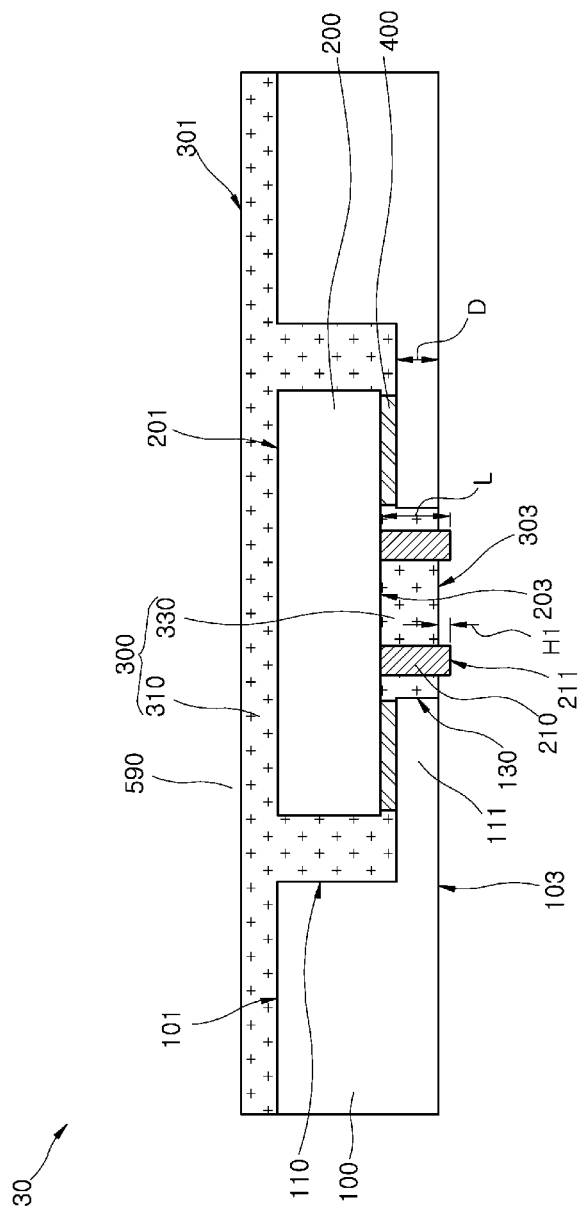
FIG. 5 is a cross-sectional view illustrating a representation of an example of a semiconductor package according to an embodiment.

FIG. 5 is a cross-sectional view illustrating a representation of an example of a semiconductor package 30 according to an embodiment. With regards to FIG. 5, the same reference numerals as used in FIGS. 1, 2 and 3 denote the same elements. Thus, descriptions of the same elements as set forth with reference to FIGS. 1, 2 and 3 will be omitted or briefly mentioned to avoid a repeated description.

Referring to FIG. 5, the semiconductor package 30 may include the first semiconductor chip 200 disposed in the cavity 110 provided in a body of the embedding substrate 100. The cavity 110 may be provided to be opened at the first surface 101 of the embedding substrate 100 and to be recessed toward the second surface 103. The third surface 201 of the first semiconductor chip 200 may be located at a level which is higher or lower than the first surface 101 of the embedding substrate 100. Alternatively, the third surface 201 of the first semiconductor chip 200 may be located at a level substantially coplanar with the first surface 101 of the embedding substrate 100.

The connection window 130 may be provided to penetrate a portion of the embedding substrate 100, which corresponds to the bottom portion 111 of the cavity 110. The connection window 130 may provide a space into which the first chip connectors 210 are inserted. The adhesive insulation layer 400 may be disposed between the fourth surface 203 of the first semiconductor chip 200 and the bottom portion 111 of the cavity 110.

Since the first chip connectors 210 such as bumps have the vertical length L which is greater than the thickness D of the bottom portion 111 of the cavity 110, the end portions 211 of the first chip connectors 210 opposite to the first semiconductor chip 200 may protrude from the sixth surface 303 of the dielectric layer 300 filling the connection window 130 by a predetermined height H1 if the first semiconductor chip 200 is disposed in the cavity 110.

The semiconductor package 30 may be configured to have a form that the first semiconductor chip 200 is embedded in a package body comprised of the embedding substrate 100 and the dielectric layer 300. The first chip connectors 210 may be located on a central portion of the first semiconductor chip 200. Since the end portions 211 of the first chip connectors 210 protrude from the sixth surface 303 of the dielectric layer 300, connection members can be directly connected to the end portions 211 of the first chip connectors 210. Thus, it may be unnecessary to remove a portion of the second dielectric portion 330 to expose the first chip connectors 210.

Figure 6:
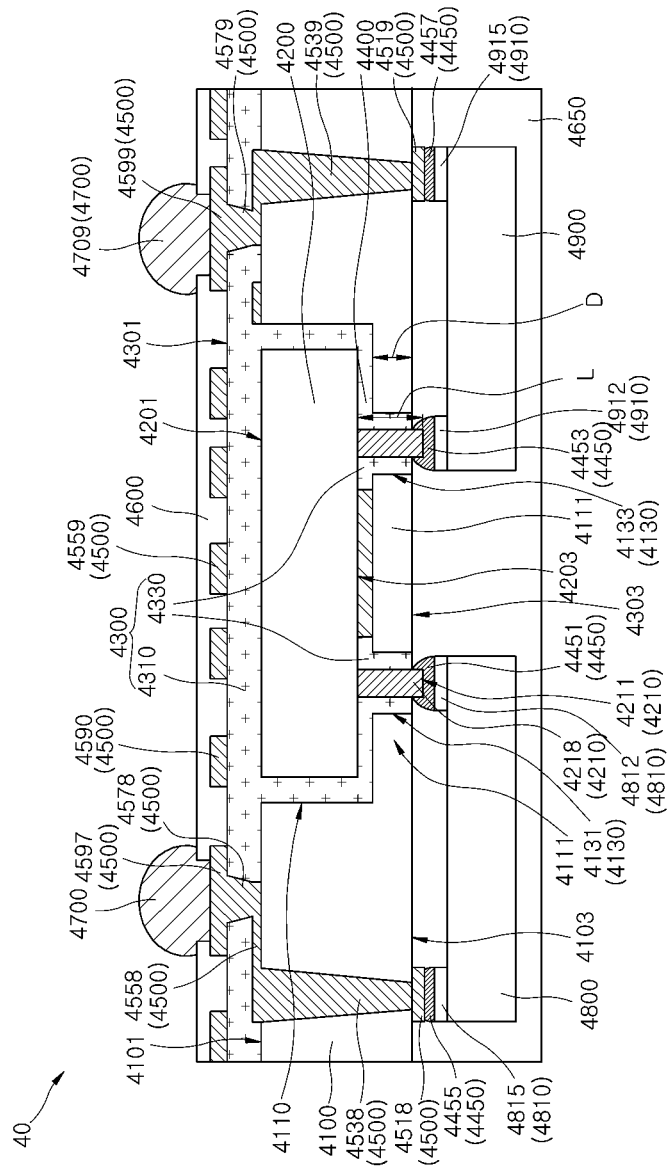
FIG. 6 is a cross-sectional view illustrating a representation of an example of a semiconductor package according to an embodiment.
Figure 7:
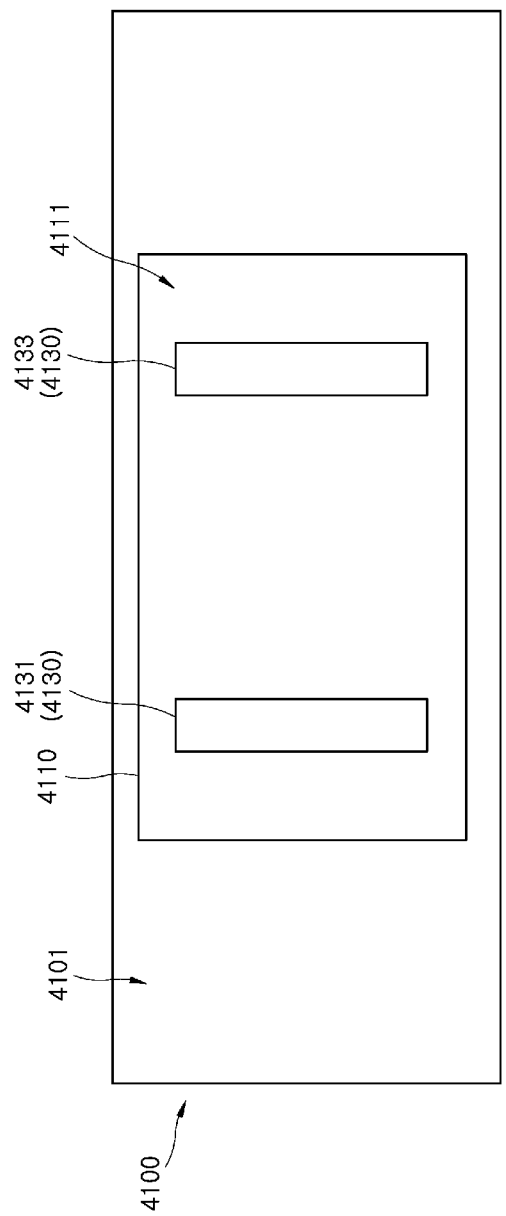
FIG. 7 is a plan view representation of an example of an embedding substrate included in a semiconductor package according to an embodiment.

FIG. 6 is a cross-sectional view illustrating a representation of an example of a semiconductor package 40 according to an embodiment. FIG. 7 is a plan view illustrating a representation of an example of an embedding substrate included in the semiconductor package 40 illustrated in FIG. 6.

Referring to FIGS. 6 and 7, the semiconductor package 40 may include a first semiconductor chip 4200 disposed in a cavity 4110 provided in a body of an embedding substrate 4100. The embedding substrate 4100 may be a substrate or a layer that includes a dielectric material and may be a plate-type member having a first surface 4101 and a second surface 4103 that face each other.

The cavity 4110 may be provided to be opened at the first surface 4101 of the embedding substrate 4100 and to be recessed toward the second surface 4103, as illustrated in FIGS. 6 and 7. A width of the cavity 4110 may be greater than a width of the first semiconductor chip 4200, and the cavity 4110 may have a groove shape. A third surface 4201 of the first semiconductor chip 4200 opposite to the second surface 4103 may be located at a level which is higher or lower than the first surface 4101 of the embedding substrate 4100. Alternatively, the third surface 4201 of the first semiconductor chip 4200 may be substantially coplanar with the first surface 4101 of the embedding substrate 4100.

A connection window 4130 may be provided to penetrate a bottom portion 4111 of the cavity 4110. The connection window 4130 may provide a space into which first chip connectors 4210 (4218 and 4219) of the first semiconductor chip 4200 are inserted. The first chip connectors 4210 may be disposed on a fourth surface 4203 of the first semiconductor chip 4200 facing the bottom portion 4111 of the cavity 4110 to electrically connect the first semiconductor chip 4200 to other elements. The first chip connectors 4210 may be disposed on both edges of the fourth surface 4203 of the first semiconductor chip 4200. The connection window 4130 into which the first chip connectors 4210 are inserted may pass through both edges of the bottom portion 4111 of the cavity 4110 to have a through hole shape or a trench shape, as illustrated in FIGS. 6 and 7. Accordingly, the connection window 4130 may include a first connection window 4131 passing through one edge of the bottom portion 4111 of the cavity 4110. The connection window 4130 may include a second connection window 4133 passing through the other edge of the bottom portion 4111 of the cavity 4110. The first and second connection windows 4131 and 4133 may have the same shape.

An adhesive insulation layer 4400 may be disposed between the fourth surface 4203 of the first semiconductor chip 4200 and the bottom portion 4111 of the cavity 4110. The adhesive insulation layer 4400 may be disposed to fix the first semiconductor chip 4200 to the bottom portion 4111 of the cavity 4110.

The first chip connectors 4210 of the first semiconductor chip 4200 may have a vertical length L. The vertical length L is greater than a thickness D of the bottom portion 4111 of the cavity 4110.

The semiconductor package 40 may further include a dielectric layer 4300 filling the cavity 4110 of the embedding substrate 4100. The dielectric layer 4300 may extend to cover the third surface 4201 of the first semiconductor chip 4200 and the first surface 4101 of the embedding substrate 4100. The dielectric layer 4300 may include a first dielectric portion 4310 substantially filling the cavity 4110 and covering the first semiconductor chip 4200 and a second dielectric portion 4330 filling the connection window 4130.

The second dielectric portion 4330 may fill a space in the connection window 4130 to surround and insulate the first chip connectors 4210 inserted into the connection window 4130. The second dielectric portion 4330 may fill the connection window 4130 not to extend onto the second surface 4103 of the embedding substrate 4100. The first dielectric portion 4310 may have a fifth surface 4301 opposite to the embedding substrate 4100. The second dielectric portion 4330 may have a sixth surface 4303 opposite to the first semiconductor chip 4200. In an example, the end portions 4211 of the first chip connectors 4210 may protrude from the sixth surface 4303 of the second dielectric portion 4330 by a certain height.

The semiconductor package 40 may further include a second semiconductor chip 4800 mounted on the second surface 4103 of the embedding substrate 4100. The second semiconductor chip 4800 may include second chip connectors 4810 to electrically connect the second semiconductor chip 4800 to other elements. The second semiconductor chip 4800 may be mounted on the second surface 4103 of the embedding substrate 4100 so that at least one first connector 4812 of the second chip connectors 4810 is electrically connected to at least one first connector 4218 of the first chip connectors 4210. The first connector 4812 of the second chip connectors 4810 may be directly combined with the first connector 4218 of the first chip connectors 4210. A conductive adhesive layer 4450, for example, a first conductive adhesive layer 4451 may be introduced to combine the first connector 4812 of the second chip connectors 4810 with the first connector 4218 of the first chip connectors 4210. The first conductive adhesive layer 4451 may include a solder material. External connectors 4700 may be disposed on the fifth surface 4301 of the dielectric layer 4300 to electrically connect the semiconductor package 40 to an external device such as, for example but not limited to, an external module board.

The semiconductor package 40 may further include conductive connection structure 4500 that are disposed in the embedding substrate 4100 and the dielectric layer 4300 to electrically connect the external connectors 4700 to the second semiconductor chip 4800. The first semiconductor chip 4200 embedded in the embedding substrate 4100 and covered with the dielectric layer 4300 may be electrically connected to the external connectors 4700 through the second semiconductor chip 4800 and the conductive connection structure 4500. The conductive connection structure 4500 may include a first internal connector 4518 that is disposed on the second surface 4103 of the embedding substrate 4100 and is electrically connected to a second connector 4815 of the second chip connectors 4810 of the second semiconductor chip 4800. A second conductive adhesive layer 4455 may be disposed to combine the second connector 4815 of the second chip connectors 4810 with the first internal connector 4518. The second conductive adhesive layer 4455 may include a solder material. The second semiconductor chip 4800 may be mounted on the embedding substrate 4100 so that the second connectors 4815 of the second chip connectors 4810 are respectively aligned and combined with the first internal connectors 4518 and the first connectors 4812 of the second chip connectors 4810 are respectively aligned and combined with the first connectors 4218 of the first chip connectors 4210.

The conductive connection structure 4500 may include a first via portion 4538 substantially penetrating the embedding substrate 4100. The first via portion 4538 may be connected to the first internal connector 4518 to act as an internal connector. The conductive connection structure 4500 may include a second via portion 4578 substantially penetrating the dielectric layer 4300 on the first surface 4101 of the embedding substrate 4100. The second via portion 4578 may be electrically connected to the first via portion

4538. The conductive connection structure 4500 may further include a first trace pattern 4558 that electrically connects the second via portion 4578 to the first via portion 4538. A second internal connector 4597 acting as a landing pad may electrically connect the second via portion 4578 to the external connector 4700. For example, the external connector 4700 may be attached to the second internal connector 4597, and second internal connector 4597 may be disposed on the second via portion 4578.

The second internal connector 4597 may be disposed on the fifth surface 4301 of the dielectric layer 4300, and a plurality of second trace patterns 4590 may also be disposed on the fifth surface 4301 of the dielectric layer 4300. A mask layer 4600 covering the second trace patterns 4590 and exposing the second internal connector 4597 may be disposed on the dielectric layer 4300.

The semiconductor package 40 may further include a third semiconductor chip 4900 mounted on the second surface 4103 of the embedding substrate 4100. The third semiconductor chip 4900 may have substantially the same function or the same shape as any one of the first and second semiconductor chips 4200 and 4800. Alternatively, the third semiconductor chip 4900 may be a semiconductor chip having a function different from functions of the first and second semiconductor chips 4200 and 4800 or having a shape different from shapes of the first and second semiconductor chips 4200 and 4800. The third semiconductor chip 4900 may be mounted on the second surface 4103 of the embedding substrate 4100 so that at least one first connector 4912 of third chip connectors 4910 of the third semiconductor chip 4900 is electrically connected to at least one second connector 4219 of the first chip connectors 4210. The first connector 4912 of the third chip connectors 4910 may be directly combined with and electrically connected to the second connector 4219 of the first chip connectors 4210.

Since the end portion 4211 of the second connector 4219 of the first chip connectors 4210 protrudes from the sixth surface 4303 of the second dielectric portion 4330, the first connector 4912 of the third chip connectors 4910 may be directly combined with the protruded end portion 4211 of the second connector 4219 of the first chip connectors 4210. The conductive adhesive layer 4450, for example, a third conductive adhesive layer 4453 may be introduced to combine the first connector 4912 of the third chip connectors 4910 with the second connector 4219 of the first chip connectors 4210. The third conductive adhesive layer 4453 may include a solder material.

External connectors 4709 may be disposed on the fifth surface 4301 of the dielectric layer 4300 to electrically connect the semiconductor package 40 to an external device such as, for example but not limited to, an external module board. The conductive connection structure 4500 may be disposed to electrically connect the external connectors 4709 to the third semiconductor chip 4900. The first semiconductor chip 4200 embedded in the embedding substrate 4100 and covered with the dielectric layer 4300 may be electrically connected to the external connectors 4709 through the third semiconductor chip 4900 and the conductive connection structure 4500. The conductive connection structure 4500 may include a third internal connector 4519 disposed on the second surface 4103 of the embedding substrate 4100 and is electrically connected to a second connector 4915 of the third chip connectors 4910 of the third semiconductor chip 4900. The third internal connector 4519 may be aligned with and connected to the second connector 4915 of the third chip connectors 4910 when the third semiconductor chip 4900 is mounted on the second surface 4103 of the embedding substrate 4100. A fourth conductive adhesive layer 4457 may be disposed to combine the second connector 4915 of the third chip connectors 4910 with the third internal connector 4519. The fourth conductive adhesive layer 4457 may include a solder material. The third semiconductor chip 4900 may be mounted on the embedding substrate 4100 so that the second connectors 4915 of the third chip connectors 4910 are respectively aligned and combined with the third internal connectors 4519 and the first connectors 4912 of the third chip connectors 4910 are respectively aligned and combined with the second connectors 4219 of the first chip connectors 4210.

The conductive connection structure 4500 may include a third via portion 4539 substantially penetrating the embedding substrate 4100. The third via portion 4539 may be connected to the third internal connector 4519. The conductive connection structure 4500 may further include a third trace pattern 4559 that may be disposed on a fifth surface 4301 of a first dielectric layer 4310. The fourth via portion 4579 may be electrically connected to one of the external connectors 4709 through a fourth internal connector 4599 acting as a landing pad to which the external connector 4709 is attached. For example, the fourth internal connector 4599 may be disposed between the fourth via portion 4579 and the external connector 4709. The semiconductor package 40 may further include a protection layer 4650 disposed on the second surface 4103 of the embedding substrate 4100 to cover and protect the second and third semiconductor chips 4800 and 4900.

Figure 8:
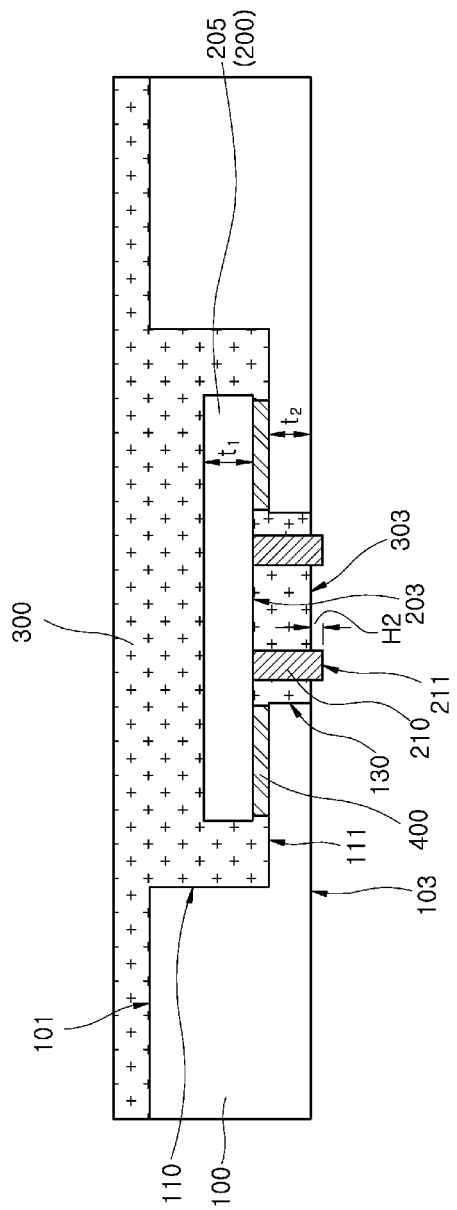
FIG. 8 is a cross-sectional view illustrating a representation of an example of a semiconductor package according to an embodiment.
Figure 9:
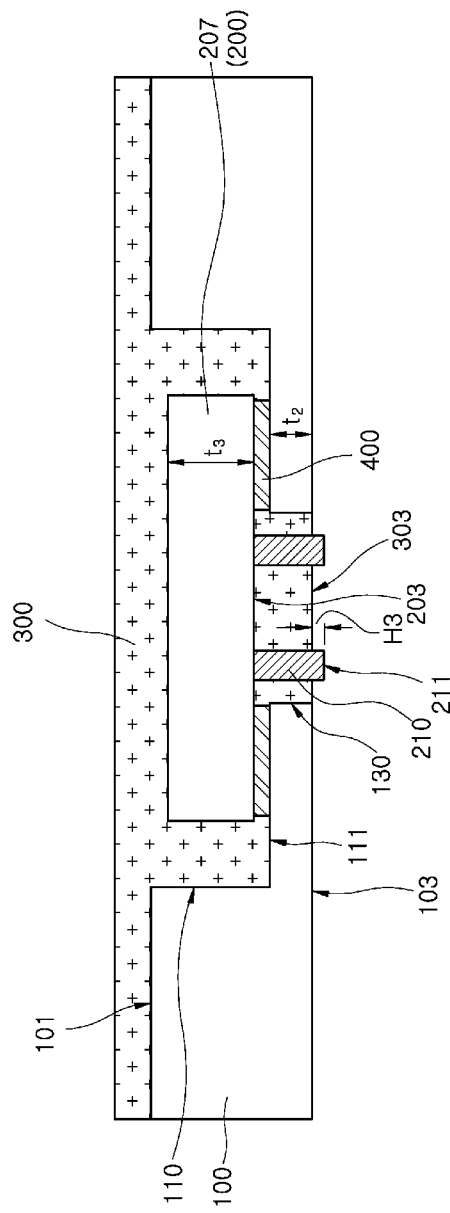
FIG. 9 is a cross-sectional view illustrating a representation of an example of a semiconductor package according to an embodiment.

FIGS. 8 and 9 are cross-sectional views illustrating representations of examples of semiconductor packages according to some embodiments. With regards to FIGS. 8 and 9, the same reference numerals as used in FIGS. 1, 2 and 3 denote the same elements. Thus, descriptions of the same elements as set forth with reference to FIGS. 1, 2 and 3 will be omitted or briefly mentioned to avoid a repeated description.

Referring to FIG. 8, a fourth semiconductor chip 205 disposed in the cavity 110 of the embedding substrate 100 of a semiconductor package according to an embodiment may have a thickness T1. Referring to FIG. 9, a fifth semiconductor chip 207 disposed in the cavity 110 of the embedding substrate 100 of a semiconductor package according to an embodiment may have a thickness T3. The thickness T3 may be greater than the thickness T1. In such an example, even though the fourth semiconductor chip 205 of an embodiment illustrated in FIG. 8 is thinner than the fifth semiconductor chip 207 of an embodiment illustrated in FIG. 9, a height H2 of the end portions 211 of the chip connectors 210 protruding from the sixth surface 303 of the dielectric layer 300 in FIG. 8 may be substantially equal to a height H3 of the end portions 211 of the chip connectors 210 protruding from the sixth surface 303 of the dielectric layer 300 in FIG. 9 because the bottom portions 111 of the embedding substrates 100 illustrated in FIGS. 8 and 9 have the same thickness and the chip connectors 210 illustrated in FIGS. 8 and 9 have the same length. In some embodiments, the heights H2 and H3 of the end portions 211 of the chip connectors 210 may be uniform and may be within the range of about 5 micrometers to about 10 micrometers. Thus, in the event that the second semiconductor chip (800 of FIG. 1) or the third semiconductor chip (900 of FIG. 1) is mounted on the second surface 103 of the embedding substrates 100, the chip connectors 210 can be directly connected to the second semiconductor chip (800 of FIG. 1) or the third semiconductor chip (900 of FIG. 1) even without using any additional bumps. The fourth or fifth semiconductor chip 205 or 207 may be embedded in the cavity 110 and the heights H2 and H3 of the end portions 211 of the chip connectors 210 may be uniform regardless of the thicknesses T1 and T3 of the fourth and fifth semiconductor chips 205 and 207, as illustrated in FIG. 8 or 9. Accordingly, in general, non-exposure of the chip connectors 210 may be prevented. That is, connection failure of the semiconductor packages illustrated in FIGS. 8 and 9 may be prevented.

Figure 10:
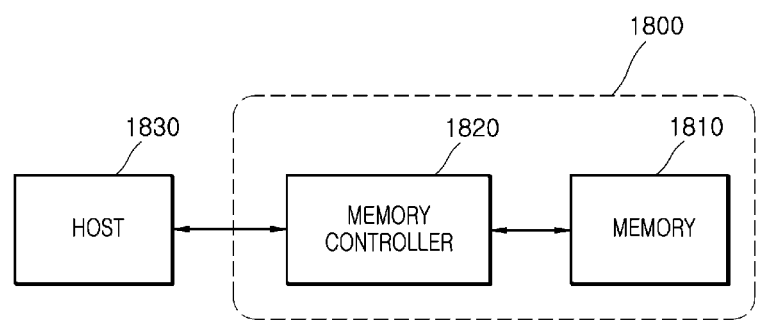
FIG. 10 is a block diagram illustrating a representation of an example of an electronic system employing a memory card including a package according to an embodiment.

FIG. 10 is a block diagram illustrating a representation of an example of an electronic system including a memory card 1800 including at least one semiconductor package according to an embodiment. The memory card 1800 may include a memory 1810, such as a nonvolatile memory device, and a memory controller 1820. The memory 1810 and the memory controller 1820 may store data or read stored data. The memory 1810 and/or the memory controller 1820 may include one or more semiconductor chips disposed in an embedded package according to an embodiment (i.e., see FIGS. 1-9 and associated text).

The memory 1810 may include a nonvolatile memory device to which the technology of the embodiments of the present disclosure is applied. The memory controller 1820 may control the memory 1810 such that stored data is read out or data is stored in response to a read/write request from a host 1830.

Figure 11:
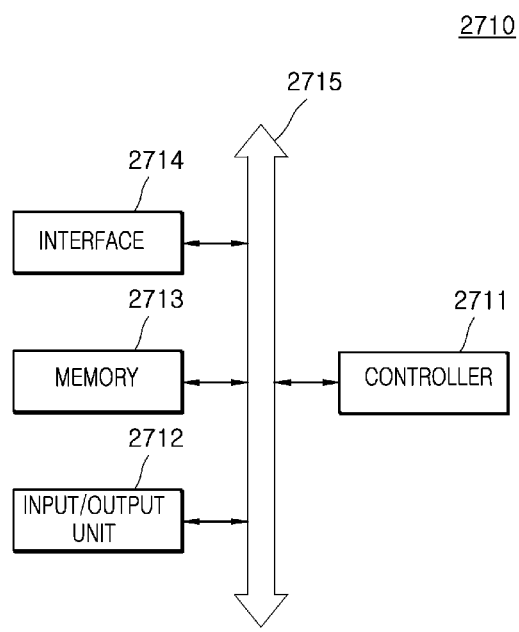
FIG. 11 is a block diagram illustrating a representation of an example of an electronic system including a package according to an embodiment.

FIG. 11 is a block diagram illustrating a representation of an example of an electronic system 2710 including at least one package according to an embodiment. The electronic system 2710 may include a controller 2711, an input/output device 2712, and a memory 2713. The controller 2711, the input/output device 2712 and the memory 2713 may be coupled with one another through a bus 2715 providing a path through which data may move.

In an embodiment, the controller 2711 may include one or more microprocessor, digital signal processor, microcontroller, and/or logic device capable of performing the same functions as these components. The controller 2711 or the memory 2713 may include one or more of the semiconductor packages according to embodiments of the present disclosure (i.e., see FIGS. 1-10 and associated text). The input/output device 2712 may include at least one selected among a keypad, a keyboard, a display device, a touchscreen and so forth. The memory 2713 is a device for storing data. The memory 2713 may store data and/or commands to be executed by the controller 2711, and the like.

The memory 2713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this example, the electronic system 2710 may stably store a large amount of data in a flash memory system.

The electronic system 2710 may further include an interface 2714 configured to transmit and receive data to and from a communication network. The interface 2714 may be a wired or wireless type. For example, the interface 2714 may include an antenna or a wired or wireless transceiver.

The electronic system 2710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 2710 is an equipment capable of performing wireless communication, the electronic system 2710 may be used in a communication system such as of CDMA (code division multiple access), GSM (global system for mobile communications), NADC (north American digital cellular), E-TDMA (enhanced-time division multiple access), WCDAM (wideband code division multiple access), CDMA2000, LTE (long term evolution) and Wibro (wireless broadband Internet).

The embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor package comprising:
   an embedding substrate including a cavity opened at a first surface of the embedding substrate and including a connection window penetrating a bottom portion of the cavity opening a second surface of the embedding substrate, the second surface of the embedding substrate opposite to the first surface;
   a first semiconductor chip disposed in the cavity and coupled to first chip connectors, the first chip connectors of the first semiconductor chip inserted into the connection window;
   a dielectric layer filling the cavity and the connection window to expose end portions of the first chip connectors and covering the first semiconductor chip; and
   a second semiconductor chip disposed on the second surface of the embedding substrate and coupled to second chip connectors, the second chip connectors of the second semiconductor chip connected to at least one of the first chip connectors,
   wherein the cavity is configured to be recessed toward the second surface.

2. The semiconductor package of claim 1, wherein the first chip connectors each have a vertical length greater than a thickness of the bottom portion of the cavity that the connection window penetrates.

3. The semiconductor package of claim 1, further comprising a third semiconductor chip disposed on the second surface of the embedding substrate,
   wherein the second and third semiconductor chips are located side by side without vertically overlapping with each other.

4. The semiconductor package of claim 3,
   wherein the third semiconductor chip is coupled to third chip connectors, and
   wherein at least one of the third chip connectors is connected to another one of the first chip connectors of the first semiconductor chip.

5. A semiconductor package comprising:
   an embedding substrate including a cavity opened at a first surface of the embedding substrate and including a connection window penetrating a bottom portion of the cavity opening a second surface of the embedding substrate, the second surface of the embedding substrate opposite to the first surface, the cavity being configured to be recessed toward the second surface;
   a first semiconductor chip disposed in the cavity and coupled to first chip connectors including a first connector and a second connector, the first connector and the second connector of the first chip connectors of the first semiconductor chip inserted into the connection window;

a dielectric layer filling the cavity and the connection window to expose end portions of the first and second connectors of the first chip connectors and covering the first semiconductor chip;

an external connector disposed on the dielectric layer;

a second semiconductor chip disposed on the second surface of the embedding substrate and coupled to a first connector of second chip connectors, the first connector of the second chip connectors of the second semiconductor chip connected to the first connector of the first chip connectors; and a conductive connection structure electrically connecting a second connector of the second chip connectors to the external connector, wherein the first semiconductor chip is electrically connected to the external connector via the first connector of the second chip connectors, the second semiconductor, and the conductive connection structure.

6. The semiconductor package of claim 5,
wherein the dielectric layer extends to cover the first surface of the embedding substrate; and
wherein the dielectric layer fills the connection window to expose the second surface of the embedding substrate.

7. The semiconductor package of claim 5, further comprising an adhesive layer fixing the first semiconductor chip to the bottom portion of the cavity.

8. The semiconductor package of claim 5, wherein the connection window is a single trench or a single hole penetrating a central portion of the bottom portion of the cavity.

9. The semiconductor package of claim 5, wherein a vertical height of the first chip connectors is greater than a vertical height of the second chip connectors.

10. The semiconductor package of claim 5,
wherein the first and second connectors of the first chip connectors each have a vertical length,
wherein the vertical length of the first connector of the first chip connector is greater than a thickness of the bottom portion of the cavity that the connection window penetrates, and
wherein the vertical length of the second connector of the first chip connector is greater than the thickness of the bottom portion of the cavity that the connection window penetrates.

11. The semiconductor package of claim 10, wherein the first and second connectors of the first chip connectors are bumps.

12. The semiconductor package of claim 5, wherein the connection window includes a pair of trenches respectively penetrating both edges of the bottom portion of the cavity.

13. The semiconductor package of claim 12,
wherein the first connector of the first chip connectors of the first semiconductor chip penetrates one of the trenches from the pair of trenches, and
wherein the second connector of the first chip connectors of the first semiconductor chip penetrates another one of the trenches from the pair of trenches.

14. The semiconductor package of claim 5, further comprising a third semiconductor chip disposed on the second surface of the embedding substrate and coupled to a first connector of third chip connectors, the first connector of the third chip connectors of the third semiconductor chip connected to the second connector of the first chip connectors,
wherein the second and third semiconductor chips are located side by side without vertically overlapping with each other.

15. The semiconductor package of claim 14, further comprising a protection layer disposed on the second surface of the embedding substrate to substantially cover the second and third semiconductor chips.

16. The semiconductor package of claim 15, wherein the protection layer includes an epoxy molding compound (EMC) material.

17. The semiconductor package of claim 5, wherein the conductive connection structure includes:
a first internal connector disposed on the second surface of the embedding substrate and connected to the second connector of the second chip connectors of the second semiconductor chip;
a first via portion penetrating the embedding substrate and connected to the first internal connector;
a second via portion penetrating the dielectric layer on the first surface of the embedding substrate and connected to the first via portion; and
a second internal connector disposed on the dielectric layer connecting the second via portion to the external connector.

18. The semiconductor package of claim 17, wherein the conductive connection structure further includes:
a first trace pattern disposed on the first surface of the embedding substrate connecting the first via portion to the second via portion; and
a second trace pattern disposed on the dielectric layer.

19. The semiconductor package of claim 17,
wherein the end portions of the first and second connectors of the first chip connectors protrude from a surface of the dielectric layer opposite to the first semiconductor chip; and
wherein a height of the protruded end portions of the first and second connectors of the first chip connectors is substantially equal to a height of the first internal connector.

* * * * *